US006998275B2

(12) United States Patent
Zhao et al.

(10) Patent No.: US 6,998,275 B2
(45) Date of Patent: Feb. 14, 2006

(54) HYDROGEN-LESS CVD TIN PROCESS FOR FERAM VIA0 BARRIER APPLICATION

(75) Inventors: Jin Zhao, Plano, TX (US); M. Grant Albrecht, McKinney, TX (US); Qidu Jiang, Plano, TX (US); Linlin Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 208 days.

(21) Appl. No.: 10/410,091

(22) Filed: Apr. 9, 2003

(65) Prior Publication Data

US 2004/0203176 A1 Oct. 14, 2004

(51) Int. Cl.
*H01L 21/20* (2006.01)
*H01L 21/44* (2006.01)
*H01L 21/26* (2006.01)
*H01L 21/00* (2006.01)

(52) U.S. Cl. .................. 438/3; 438/685; 438/653; 438/798; 438/396

(58) Field of Classification Search ............... 438/3, 438/685, 627, 643, 653, 798, 239, 250, 396
See application file for complete search history.

(56) References Cited

U.S. PATENT DOCUMENTS

| | | | |
|---|---|---|---|
| 6,211,035 B1 | 4/2001 | Moise et al. | |
| 6,261,967 B1 | 7/2001 | Athavale et al. | |
| 6,284,654 B1 | 9/2001 | Roeder et al. | |
| 6,316,797 B1 | 11/2001 | Van Buskirk et al. | |
| 6,320,213 B1 | 11/2001 | Kirlin et al. | |
| 6,709,991 B1 * | 3/2004 | Kawahara et al. | 438/791 |
| 2001/0034106 A1 | 10/2001 | Moise et al. | |
| 2001/0044205 A1 | 11/2001 | Gilbert et al. | |
| 2002/0021544 A1 * | 2/2002 | Cho et al. | |

OTHER PUBLICATIONS

"FeRAM Tutorial", Ali Sheikholeslami and P. Glenn Gulak, A Survey of Circuit Innovations in Ferroelectric Random-Access Memories, Proceedings of the IEEE, vol. 88, No. 3, May, 2000, 3 pages, printed from the Internet at: htt://ww.eecg.toronto.edu/-ali/ferro/tutorial.html.

"A Survey of Circuit Innovations in Ferroelectric Random Access Memories", Ali Sheikholeslami and P. Glenn Gulak, Proceedings of the IEEE, vol. 88, No. 5, May, 2000, pp. 667-689.

"Generic CVD Reactor", CVD Basics, Daniel M. Dobkin, Dec. 7, 2001, 3 pages, printed from the Internet at: http://www.batnet.com/enigmatics/semiconductor_processing/CVD_Fundamentals/introduc . . . .

"Physical Vapor Deposition", Cougar Labs, Inc., Dec. 7, 2001, 9 pages, printed from the Internet at: http://www.cougarlabs.com/pvd1.htmel.

"Hydrogen Passivation and Silicon Nitride Deposition Using an Integrated LPCVD Process", Th. Pernau, M. Spiegel, G. Kragler, P. Fath and E. Bucher, 4 pages, printed from the Internet at: http://www.uni-konstanz.de/FuF/Physik/Bucher/pdf/VA1_42 Pernan_et _a.pdf.

* cited by examiner

*Primary Examiner*—Ha Tran Nguyen
(74) *Attorney, Agent, or Firm*—Jacqueline J. Garner; W. James Brady, III; Frederick J. Telecky, Jr.

(57) ABSTRACT

The present invention is directed to a method of forming a diffusion barrier layer for a FeRAM capacitor, which includes depositing a chemical vapor deposited titanium nitride layer in a via, and treating the chemical vapor deposited titanium nitride layer using a plasma treatment substantially excluding hydrogen.

11 Claims, 8 Drawing Sheets

HYDROGEN-LESS CVD TIN PROCESS FOR FERAM VIA0 BARRIER APPLICATION

FIELD OF THE INVENTION

The present invention relates generally to the field of integrated circuit processing, and more particularly relates to a method of manufacture of a chemical vapor deposited TiN barrier layer used in association with an FeRAM capacitor.

BACKGROUND OF THE INVENTION

Several trends exist today in the semiconductor device fabrication industry and the electronics industry. Devices are continuously getting smaller and smaller and requiring less and less power. A reason for this is that more personal devices are being fabricated that are small and portable, thereby relying on a small battery as its supply source. For example, cellular phones, personal computing devices, and personal sound systems are devices that are in great demand in the consumer market. In addition to being smaller and more portable, personal devices are requiring more computational power and on-chip memory. In light of all these trends, there is a need in the industry to provide a computational device that has a fair amount of memory and logic functions integrated onto the same semiconductor chip. Preferably, this memory will be configured such that if the battery dies, the contents of the memory will be retained. Such a memory device that retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FeRAM) is a non-volatile memory that utilizes a ferroelectric material, such as strontium bismuth tantalate (SBT) or lead zirconate titanate (PZT), as the capacitor dielectric situated between a bottom electrode and a top electrode. Both read and write operations are performed for a FeRAM. The memory size and memory architecture affect the read and write access times of a FeRAM. Table 1 illustrates the differences between different memory types.

rations, in which data is read from or written to the device using address signals and various other control signals. The individual memory cells typically comprise one or more ferroelectric capacitors (FeCaps) adapted to store a binary data bit, as well as one or more access transistors, typically MOS devices, operable to selectively connect the FeCap to one of a pair of complimentary bit lines, with the other bit line being connected to a reference voltage. The individual cells are commonly organized as individual bits of a corresponding data word, wherein the cells of a given word are accessed concurrently through activation of plate lines and word lines by address decoding circuitry.

Ferroelectric memory devices provide non-volatile data storage where data memory cells include capacitors constructed with ferroelectric dielectric material that may be polarized in one direction or another in order to store a binary value. The ferroelectric effect allows for the retention of a stable polarization in the absence of an applied electric field due to the alignment of internal dipoles within perovskite crystals in the dielectric material. This alignment may be selectively achieved by application of an electric field to the ferroelectric capacitor in excess of the coercive field of the material. Conversely, reversal of the applied field reverses the internal dipoles. Although the polarization of each individual dipole is relatively small, the net polarization of several domains, each comprising a number of aligned dipoles, can be large enough for detection using, for example, standard sense amplifier designs. The gross effect of polarization is a nonzero charge per unit area of the ferroelectric capacitor that does not disappear over time.

Figure 1A:
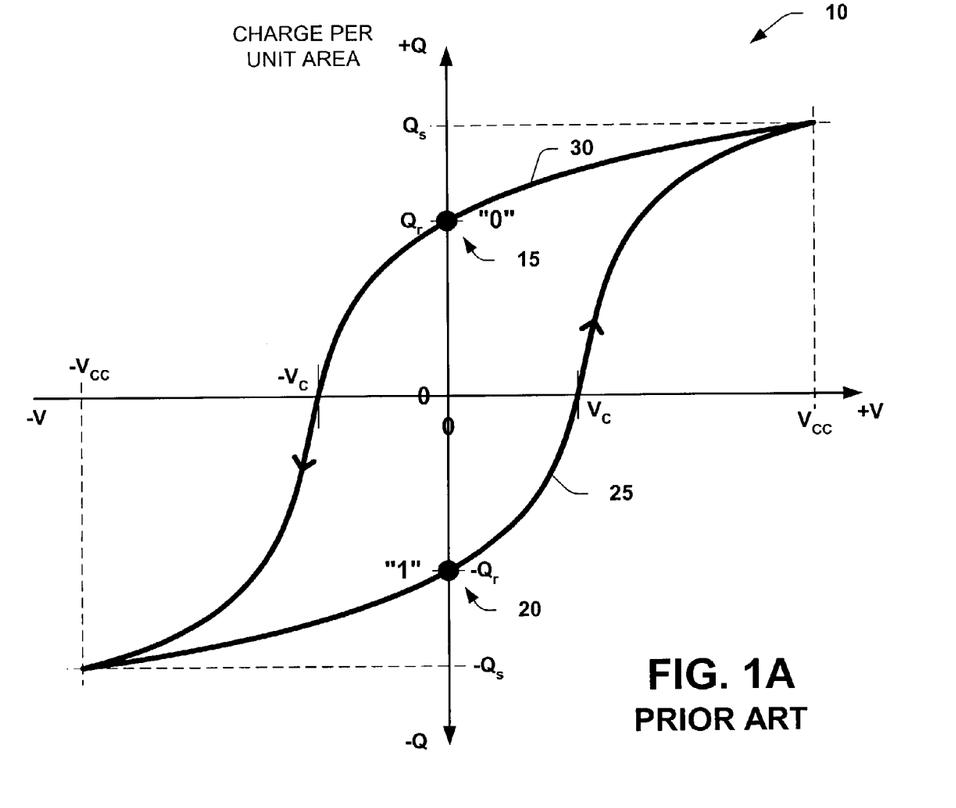
FIG. 1A is a characteristic curve plot of the ferroelectric capacitor, illustrating a polarization charge density "Q" (y-axis) in response to a program voltage "V" (x-axis), including a characteristic placement relationship of a "1" data state and a "0" data state in a typical FeCap.

A plot 10 of the characteristic hysteresis loop for a conventional ferroelectric capacitor is shown in FIG. 1A, and displays the total charge on the ferroelectric capacitor as a function of the applied voltage. Plot 10 illustrates the charge "Q" (Y-axis), and the voltage "V" (X-axis). Remnant charge (Qr), saturation charge (Qs), and coercive voltage (Vc) are three important parameters that characterize the loop. When the voltage across the capacitor is 0V, the capacitor assumes one of the two stable states: "0" 15 or "1" 20. The total charge stored on the capacitor is Qr for a "0" 15 or −Qr for a "1" 20. A "0" can be switched to a "1" by

TABLE 1

| Property | SRAM | Flash | DRAM | FeRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^{15}$ | >$10^{15}$ | >$10^{13}$ |
| Read Time (single/multi-bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

Ferroelectric memory devices, and other types of semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) configuapplying a negative voltage pulse across the capacitor. By doing so, the total charge on the capacitor is reduced by 2Qr, a change of charge that can be sensed by the sense amplifier (amp). Similarly, a "1" can be switched back to a "0" by applying a positive voltage pulse across the capacitor, hence restoring the capacitor charge to +Qr.

Figure 1B:
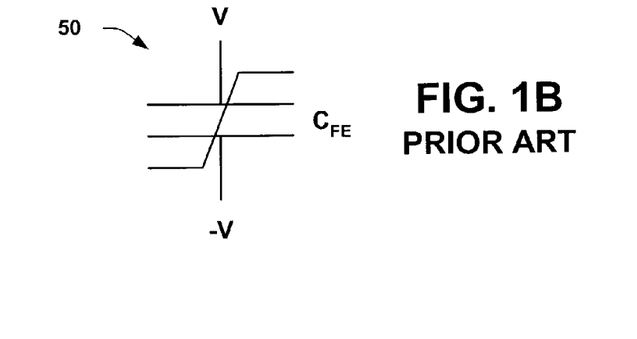

Characteristic curve segment 25 represents the charge path of a FeCap from a "1" state 20, thru Vcc as charge is applied, and then thru curve segment 30 to the other stable "0" state 15 as the voltage is relaxed to the FeCap. FIG. 1B is the schematic symbol 50 of the FeCap of FIG. 1A with capacitance $C_{FE}$, while the "+" and "−" signs beside the FeCap symbol represent the applied voltage polarity.

Ferroelectric thin films, such as those made of PZT are promising materials for FeRAM use, however, problems still remain concerning its integration within the silicon process. One of the biggest problems that PZT suffers in the integration is the disappearance of polarization hysteresis characteristics and an increase of leakage current during passivation in an atmosphere containing hydrogen. It has been documented that hydrogen attaches to the PZT film degrading the switched polarization characteristics and increasing the leakage current of the PZT layer.

As current trends continue, the need for increased levels of device integration and process scaling has also increased. One consequence of process technology scaling is the need for higher densities of low resistivity circuit elements as scaling continues downward. Additionally, with the increasing number of scaled down memory cells required on a chip, FeRAM cells need to be manufactured to a high degree of uniformity for the associated read/write circuitry.

Accordingly, there is a need for high density FeRAM memory circuits having low resistivity circuit elements manufactured with processes that insure a high level of uniformity between memory cells, while retaining the switched polarization and low leakage characteristics of the PZT layer.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a method of forming a diffusion barrier layer used in association with an FeRAM capacitor or another such semiconductor device utilizing a ferroelectric dielectric film. The method decreases hydrogen diffusion into the PZT dielectric layer during subsequent TiN diffusion barrier layer passivation of the VIA0, hardmask, or other such formations of an FeRAM capacitor that utilize a TiN barrier layer. Hydrogen diffusion into the PZT dielectric layer is decreased by substantially excluding the use of hydrogen, for example, during passivation of the TiN diffusion barrier layer of the VIA0 connection to the top electrode of the capacitor. According to the method of the present invention, the switched polarization level and leakage current of the FeRAM cell may be improved substantially over the prior art. In addition, the processes of the present invention densify the TiN film while improving the film conductivity, also known as the "sheet resistance" of the TiN film.

The method comprises depositing a titanium nitride layer in a via (e.g., VIA0), and treating the titanium nitride layer using a plasma treatment substantially excluding hydrogen (the $H_2$-less plasma treatment method). As previously discussed, hydrogen has been found to attach to the PZT ferroelectric dielectric film, degrading the switched polarization characteristics and increasing the leakage current in the PZT film. During the integration of the PZT materials and the silicon process, the contributors of the present invention have identified the VIA0 barrier materials of the CVD TiN deposition as one of the major hydrogen sources for the contamination of the PZT film. The contributors to the invention have found that after the chemical vapor deposition of titanium nitride (CVD TiN) and subsequent hydrogen passivation, hydrogen diffuses through the VIA0 metal layers (e.g., Ti and TiN) into the PZT film, thus leading to the degradation of polarization and the increased leakage current.

To mitigate these negative effects, the method of the present invention essentially excludes the hydrogen in the atmospheres of the TiN CVD depositions and the TiN plasma treatment, and substitutes additional nitrogen to maintain the same gas flow rates. Comparable sheet resistance and uniformity of the TiN diffusion barrier layer are achieved by adjusting the process parameters of the method. Thus, one aspect of the present invention addresses the high density and low resistivity circuit elements needed as a result of process technology scaling. For example, the contributors to the present invention have found that by extending the plasma treatment time from 35 seconds to 50 seconds, and the flow rate of $N_2$ from 200 sccm to 500 sccm, that comparable results were attained in the final film without PZT degradation due to hydrogen.

Several requirements either presently exist or may become requirements for the integration of FeRAM with other device types. One such requirement involves utilizing, as much as possible, the conventional front end and back end processing techniques used for fabricating the various logic and analog devices on the chip to fabricate chips which will include FeRAM devices. In addition, it is also advantageous to effectively and economically use existing or otherwise commercially available processing tools. In other words, it is beneficial to utilize as much of the process flow for fabricating standard logic devices as possible, so as not to greatly disturb the process flow (and thus increase the process cost and complexity) merely to integrate the FeRAM devices onto the chip.

For example, the FeRAM devices preferably are not degraded by the back end process flow with minimal, if any, modification. This is a significant challenge since ferroelectric capacitors have been shown to be sensitive to hydrogen degradation and most logic back end process flows use hydrogen/deuterium in many of the processes ($SiO_2$, $Si_3N_4$, and CVD W deposition, $SiO_2$ via etch, and forming gas anneals). Beneficially, the method of the present invention easily achieves a goal of no process flow or tool changes, by substantially removing the use of hydrogen, increasing the use of nitrogen and processing for a longer period of time in the TiN film formation. In addition, the process may be further enhanced without process flow or tool changes, by performing the plasma treatment at a higher power level.

In accordance with one aspect of the present invention, a method of forming an FeRAM capacitor is provided in which a TiN diffusion barrier layer is employed and formed substantially excluding hydrogen. The contributors to the present invention discovered that a prior art hydrogen passivation of the TiN barrier is a source of integration problems subsequent to the processing of the FeRAM capacitor. More particularly, it was found that the use of hydrogen in a plasma treatment for the TiN film (either the top diffusion barrier in the VIA0 or the hard mask) caused degradation of the underlying PZT film.

The contributors to the present invention, having appreciated the above problem with the prior art, overcome the difficulties associated therewith by substantially excluding hydrogen from the plasma treatment of the TiN barrier layer or hard mask. Such an exclusion, however, is not a mere substitution of another material (the additional $N_2$) because one of ordinary skill in the art would not be motivated to reduce the hydrogen in the treatment of such a layer because such a reduction increases the electrical resistance (sheet resistance $R_s$) of the resulting barrier layer. The contributors to the present invention, however, realized that the switched polarization (PSW) characteristic is more important to the FeRAM than the $R_s$ of the TiN. In addition, the contributors discovered that by adding an amount of nitrogen approximately equal to that of the hydrogen excluded, one could maintain a similar gas flow without disturbance to the process.

One of ordinary skill in the art would also not be motivated to process the TiN barrier layer for a longer time as the prior art hydrogen passivation of the TiN film had a nearly flat $R_s$ response with respect to an increase in processing time. The contributors to the present invention, however, discovered that by combining the exclusion of the hydrogen contaminate and increasing the processing time, the sheet resistance significantly improves with additional processing time, to regain a comparable resistivity of the TiN to a prior art TiN film treated with a hydrogen containing plasma.

Finally, one of ordinary skill in the art would not be motivated to eliminate the hydrogen from the passivation process of the TiN film, as the exclusion of hydrogen produces a TiN barrier layer which is not as clean or as dense as that produced by hydrogen passivation. The contributors to the present invention again, however, discovered that by combining the exclusion of hydrogen with the increased processing time, the final carbon and oxygen content levels in the final TiN film are brought down to comparable percentage levels and to acceptable densification levels. Beneficially, a couple of unexpected results were obtained in the plasma treatment of the present invention. Specifically, the PSW distribution range of the ferroelectric capacitors were substantially improved with the $H_2$-less plasma treatment method, while another increase in the PSW level was revealed in a variation of the method, wherein an argon pre-sputter cleaning was employed prior to the Ti and TiN CVD depositions and the $H_2$-less plasma treatment method of the present invention.

In accordance with one exemplary aspect of the present invention, it is desirable to have a sufficiently high density barrier layer in the via that connects to the top electrode portion of the capacitor. Therefore in tailoring the TiN film density, it is desired to keep the percentage of carbon and oxygen therein sufficiently low such that the film density does not substantially exceed a predetermined level. For example, with the $H_2$-less plasma treatment method of the present invention, a TiN composition of about 40.5% Ti, 41.5% N, 12% C, and 6% O was obtained providing a densification of about 35%.

In accordance with another exemplary aspect of the present invention, it is desirable to have a sufficiently low and uniform barrier layer sheet resistance $R_s$. Therefore in tailoring the TiN film resistivity, it is desired to keep the contamination therein sufficiently low such that the film resistivity does not substantially exceed a predetermined level. For example, with a $Ti[N(CH_3)_2]_4$ TDMAT precursor in an $N_2$ atmosphere which excluded $H_2$, a film sheet resistance of about 362 Ω/sq was obtained after about 35 seconds of plasma treatment at 450° C., and a power level of about 750 watts. In addition, an improved film resistivity of about 330 Ω/sq was obtained by extending the plasma treatment to about 50 seconds.

In accordance with another aspect of the present invention, a TiN film may be used as a hard mask structure for forming the ferroelectric capacitor stack. Accordingly, a TiN hard mask is disclosed in which one or more hard masking layers of TiN formed without a hydrogen plasma treatment protect the underlying top electrode, thereby preventing exposure thereof.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 B is an accompanying schematic symbol of the Ferroelectric capacitor of FIG. 1A, and a typical voltage direction applied across the FeCap;

DETAILED DESCRIPTION OF THE INVENTION

The present invention will now be described with respect to the accompanying drawings in which like numbered elements represent like parts. While the following description of the present invention relates to a method of formation and the plasma treatment of a TiN diffusion barrier layer used in association with a ferroelectric capacitor and other such FeRAM devices, the instant invention can be used to form and treat a TiN film. In particular, the improved performance of the FeRAM device of the instant invention compared to standard semiconductor memories appears to make FeRAM the memory of choice for devices that require low power and a large degree of device integration.

The figures provided herewith and the accompanying descriptions of the figures are provided merely for illustrative purposes. Based on the instant description, other devices and structures are anticipated according to the formation and treatment methods illustrated in the figures and in the following description. For example, while VIA0 barrier layer structures are illustrated, any structures utilizing a conductive diffusion barrier layer may be used, such as a TiN hard mask.

In accordance with the present invention, a plurality of methods are disclosed which decrease hydrogen contamination of the PZT dielectric layer during subsequent TiN diffusion barrier layer formation and passivation processes (e.g., VIA0, hardmask, or other such formations of an FeRAM capacitor utilizing the TiN film). By decreasing hydrogen diffusion into the PZT dielectric layer from the substantial reduction of hydrogen used, for example, during passivation of the TiN film of the VIA0 connection to the top electrode, a switched polarization level and leakage current of the FeRAM cell is improved substantially over the prior art. In addition, the processes of the present invention densify the TiN film while improving the film conductivity.

Figure 2:
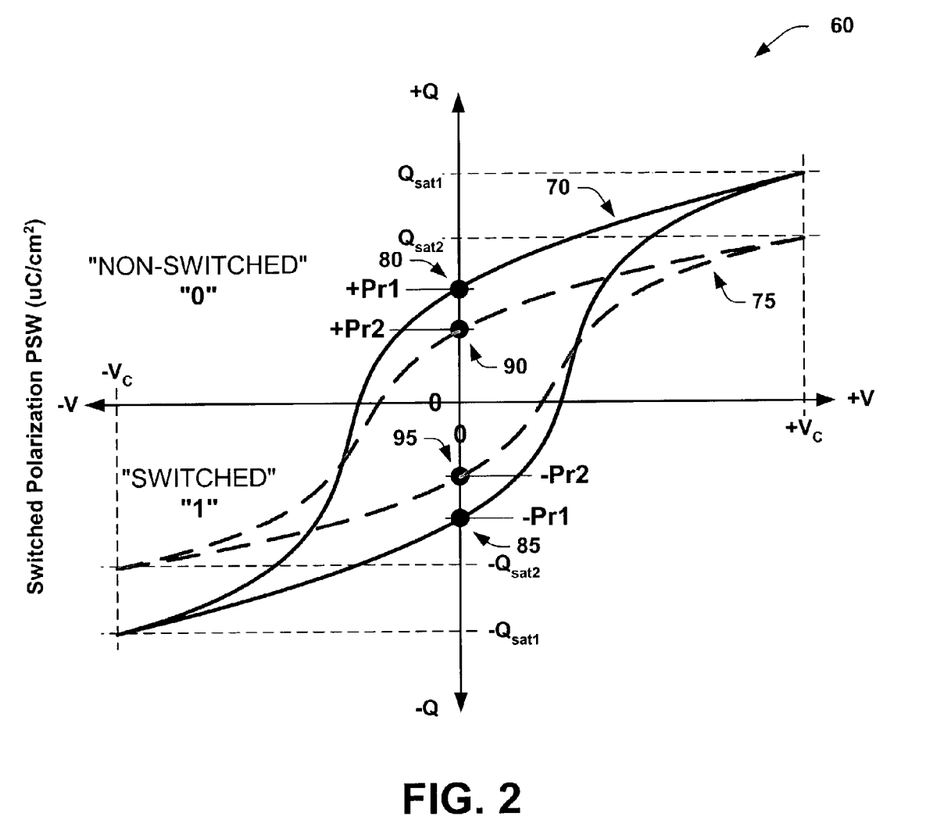
FIG. 2 is a plot of two characteristic hysteresis curves of a ferroelectric capacitor, illustrating a polarization charge density "Q" (y-axis) in response to a program voltage "V" (x-axis) applied to an FeRAM memory cell with and without PZT degradation resulting from hydrogen passivation, including the reduced polarization saturation charge levels and corresponding data states with reduced read sense margins.

Referring initially to FIG. 2, a plot 60 of two characteristic hysteresis curves of two similar ferroelectric capacitors, illustrating a switched polarization charge density "Q" (y-axis) in response to a program voltage "V" (x-axis), such as may be applied to an FeRAM memory cell. Curve 70 illustrates the switched polarization (PSW) response of an ideal ferroelectric capacitor (FeCap) to a program voltage without degradation to the PZT dielectric film. By contrast, curve 75 illustrates the PSW response of a similar ferroelectric capacitor to a program voltage after a prior art hydrogen passivation plasma treatment of the TiN BL within the VIA0 for the top electrode of the FeCap. Curve 75 demonstrates that degradation of the PZT dielectric film has taken place as a result of hydrogen diffusion into the ferroelectric dielectric film.

FIG. 2 also shows a reduction in the saturation level of the PSW between curve response 70 and 75 as illustrated by $+/-Q_{sat1}$ and $+/-Q_{sat2}$ in response to program voltages $+/-V_c$. Curve 70 illustrates a non-switched "0" data state +Pr1 80, and a switched "1" data state −Pr1 85, while curve 75 of the hydrogen passivated FeCap illustrates reduced PSW levels at the corresponding "0" data state +Pr2 90, and the switched "1" data state −Pr2 95. Because of these reduced PSW levels, the read sense margins, as seen by typical read sense amplifiers will also be reduced, which may result in read errors, reduced endurance, longer access times of the FeRAM cell, and other such difficulties.

The contributors to the present invention have realized that hydrogen diffusion into the PZT dielectric layer, whether from hydrogen passivation of a TiN film in a via or of a TiN hard mask associated with the electrode of an FeCap, exhibits this problem of attaching to the PZT materials and degrading the PSW thereof. In addition, the contributors to the present invention have further realized and discovered that hydrogen diffusion into the PZT material is a contaminant to the dielectric, increasing the majority carriers in these regions and causing a detrimental increase in leakage current of the dielectric layer. Thus, hydrogen passivation of TiN films utilized in association with structures in the proximity of the PZT dielectric layer of an FeCap is undesirable with the FeRAM devices and process scaling densities considered.

Figure 3:
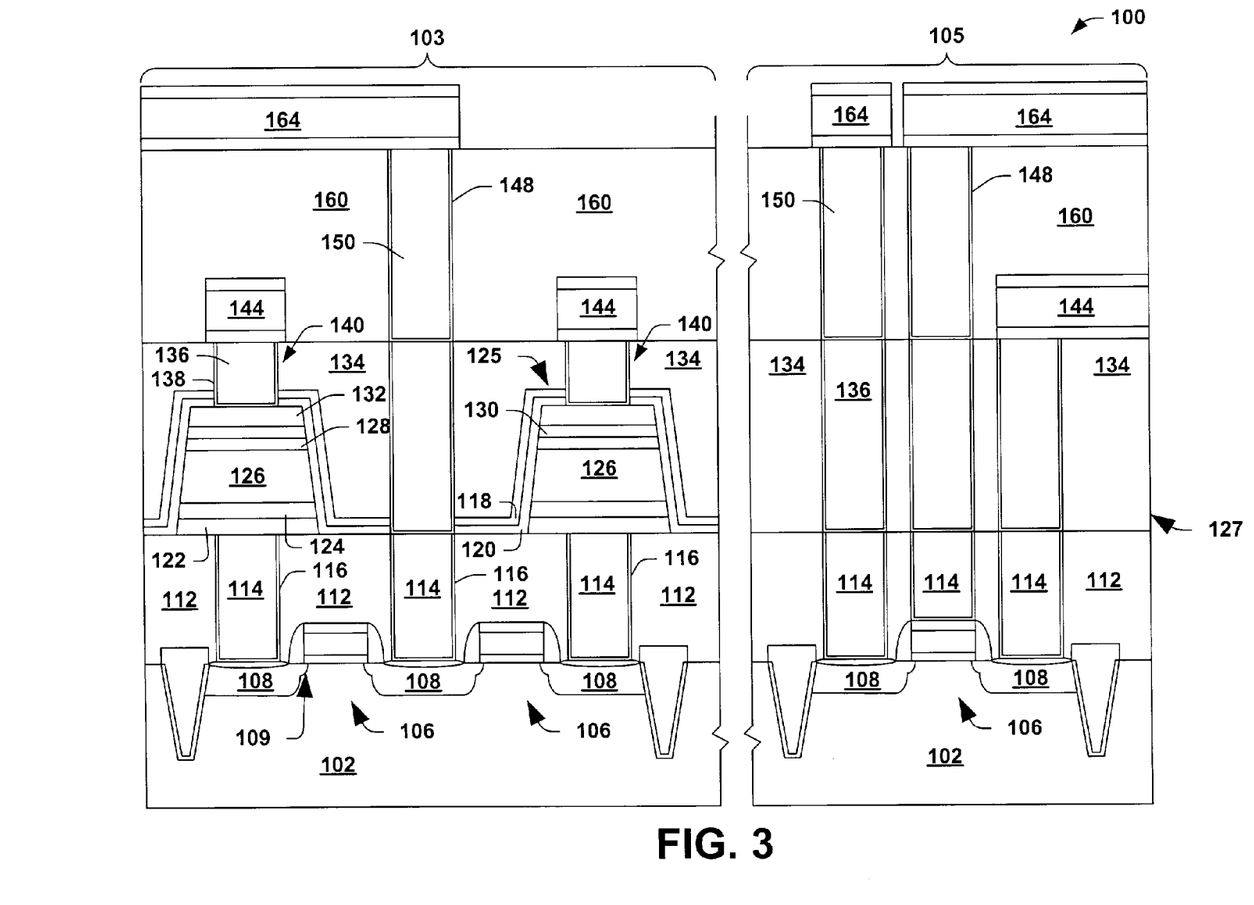
FIG. 3 is a fragmentary cross-sectional view of a partially fabricated device containing FeRAM capacitors and transistors associated therewith fabricated in accordance with one exemplary aspect of the present invention.

FIG. 3 is now presented to better appreciate the environment of the devices and structures associated with the TiN BL formed and discussed in connection with the method of the present invention. In FIG. 3, an exemplary, fragmentary cross section of a semiconductor device 100 is provided in which two devices are illustrated. While structure 102 is preferably a single-crystal silicon substrate that is doped to be n-type or p-type structure 102, the substrate 102 may be formed by fabricating an epitaxial silicon layer on a single-crystal silicon substrate. A first device 103 represents a partially fabricated version of an FeRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, gate structures 106 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 106 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

A dielectric layer 112 is formed over the entire substrate 102 and is patterned and etched so as to form openings for contacts to the substrate and gate structures 106 to be formed. These openings are filled subsequently with one or more conductive materials, such as a plug 114 (for example, comprising a metal such as tungsten, molybdenum, titanium, titanium nitride, tantalum nitride, or a metal silicide such as Ti, Ni or Co, copper or doped polysilicon). A liner/barrier layer 116 may or may not be formed between the plug 114 and dielectric 112. Such a liner/barrier layer 116 comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP). In addition, an added diffusion barrier/etch stop (not shown) may be included near the top surface of layer 112 such as $AlO_x$, AlN, $Si_3N_4$, $TiO_2$, $ZrO_2$, or $TaO_x$ that would be deposited after the planarization process. This diffusion barrier is particularly useful if damascene processes are used to create the via or metallization to the contact. The formation of the plug 114 will require etching through this optional barrier/etch stop.

Formation of metal structures that are situated above the contacts is considered to be part of the back end process. Other than the specific FeRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 112, 134 and 160). If formed, this thin dielectric comprises, for example, silicon nitride, silicon carbide, SiCNO or a silicon oxide (for example, a high-density plasma oxide). In addition, interlevel dielectric layers 112, 134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148) comprises, for example, Ti, TiN, W, tungsten nitride, Ta, tantalum nitride, any conventional barrier/liner layer, or any combination or multi-layer stack thereof. For example, the barrier/liner layer may be a single TiN barrier layer, or a multi-layer stack of Ti and TiN barrier/liner layers. When the plug and the barrier/liner layer is formed within ILD layer 134, they form a structure which is often referred to as a VIA0 140.

The interlayer dielectric and plug material should be compatible with the FeRAM thermal budget. With existing technology (i.e., one that incorporates a W plug and $SiO_2$ ILD), the FeRAM thermal budget should be less than approximately 600 or 650 C, however, the present invention is not limited thereto. If the ILD is modified to include a low dielectric constant ("low K") layer, the FeRAM thermal budget may need to be reduced further. The preferred interlayer dielectric 112 is therefore a material that can withstand a thermal budget in excess of 600 C, such as silicon oxide (doped and/or undoped), silicon nitride, and/or silicon oxy-nitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of the backend process. In particular, this level allows FeRAM devices with capacitor under bit line configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

Initially, a further discussion of FIG. 3 will be provided to appreciate the structure of an FeRAM cell and an exemplary integration position of such a cell within a semiconductor fabrication process. Subsequently, a flow chart will be provided to illustrate an exemplary process for fabricating a VIA0 over such an FeRAM cell in order to provide a context in which the present invention may reside. In conjunction therewith, the present invention will be described and illustrated in greater detail. It should be understood, however, that although the present invention will be shown and described in conjunction with one exemplary context, the invention is applicable to other fabrication methodologies, structures and materials, and such alternatives are contemplated as falling within the scope of the present invention.

An FeRAM capacitor, as illustrated in FIG. 3 at reference numeral 125, resides above the interlayer dielectric 112, and comprises several layers. The FeRAM capacitor 125 of FIG. 3 comprises an electrically conductive barrier layer 122 upon which a conductive bottom capacitor electrode 124 resides (hereinafter, the terms conductive and insulative are employed to indicate electrically conductive and electrically insulative, respectively, unless indicated otherwise). A capacitor dielectric layer 126, a ferroelectric material, is formed over the bottom electrode 124, and is covered by, for example, a conductive multi-layer top electrode 128, 130. A top portion of the FeRAM capacitor 125 comprises a hard mask layer 132 that may be employed to facilitate the capacitor stack etch. The capacitor stack may then be covered with a single or multi-layer sidewall diffusion barrier 118, 120.

As discussed above, a via (e.g., VIA0 140) may be formed comprising the plug 136 (e.g., W) and the barrier/liner layer 138 formed within the ILD layer 134. However, as has also been discussed, hydrogen from the hydrogen passivation of the barrier/liner or hardmask layers may diffuse into the PZT dielectric layer of nearby FeCaps in a prior art, causing degradation of PSW characteristics and increased leakage current. Although the following discusses a method of forming a via over an FeCap, it is also contemplated that the method and process of the present invention may be applied to any via or layer utilizing the H$_2$-less CVD TiN process below, alongside, or anywhere in the general vicinity of an FeRAM capacitor or another such ferroelectric device.

An exemplary method of forming a via in the proximity of an FeRAM capacitor in accordance with the present invention which is similar in many respects to the VIA0 140 and the capacitor 125 of FIG. 3 will now be discussed in conjunction with FIG. 4, wherein a method 400 of forming and filling a via using the H$_2$-less CVD TiN process is disclosed. Prior to the beginning of the process, an FeRAM capacitor 125 is formed, including an interlevel dielectric 134 and an opening in the ILD defining the via. The H$_2$-less CVD TiN process then begins at 405. At 410 the opening in the ILD defining the via is cleaned by an argon pre-sputter cleaning. Such a pre-sputter is not required, but is preferred since it advantageously cleans the interface (e.g., removes any interfacial oxide or other contaminates) to improve the conductivity of the resultant via/top electrode interface. At 415, a conductive barrier/liner layer 138 (e.g., a 240 A thick layer of Ti) is deposited in the VIA0 opening, followed by another barrier/liner layer 138 (e.g., a 70 A thick layer of TiN) deposited at 420 over the first layer. The TiN barrier/liner layer 138 then receives a plasma treatment at 425 in an atmosphere that excludes hydrogen (e.g., using about 500 sccm N$_2$, at about 450° C. and 750 watts for about 50 seconds) and results in 40 A final thickness of CVD TiN. The plasma treatment 425 of the present invention differs substantially from the prior art that typically employ a hydrogen based plasma treatment to density the TiN film.

At 430 the barrier/liner layer 138 (e.g., TiN) deposition and plasma treatment processes may be repeated one or more times to form a thicker barrier/liner layer 138, for example, about 80 A thick over the 240 A Ti layer. At 440, a conductive plug is formed within the VIA0, for example, a tungsten (W) plug 136 is formed in the via, wherein the barrier/liner layer 138 (e.g., Ti, TiN) is disposed between the plug 136 and the ILD 134 to avoid oxidation of the tungsten plugs. Alternatively, if the plugs 136 are copper, the barrier 138 serves to prevent out-diffusion of the copper into the ILD 134. Thereafter, at 450, the H$_2$-less CVD TiN process ends and a backend process may continue for forming other ILD layers and contacts of the ferroelectric device.

Such a barrier is electrically conductive and serves to provide an effective diffusion barrier without having to use hydrogen in the plasma treatment process of the TiN barrier. According to one exemplary aspect of the present invention, the plasma treatment process is adjusted to compensate for the substantial exclusion of hydrogen. By the addition of more nitrogen and plasma treating for a longer period of time (which may further be enhanced with the addition of more processing power) sufficient passivation and densification of the barrier/liner layer 138 is provided. In one example, the hydrogen is excluded, the nitrogen is increased from 200 to 500 sccm, and the processing time is increased from 35 to 50 seconds while the process temperature and power levels remain about the same (see, e.g., FIG. 10).

Figure 5:
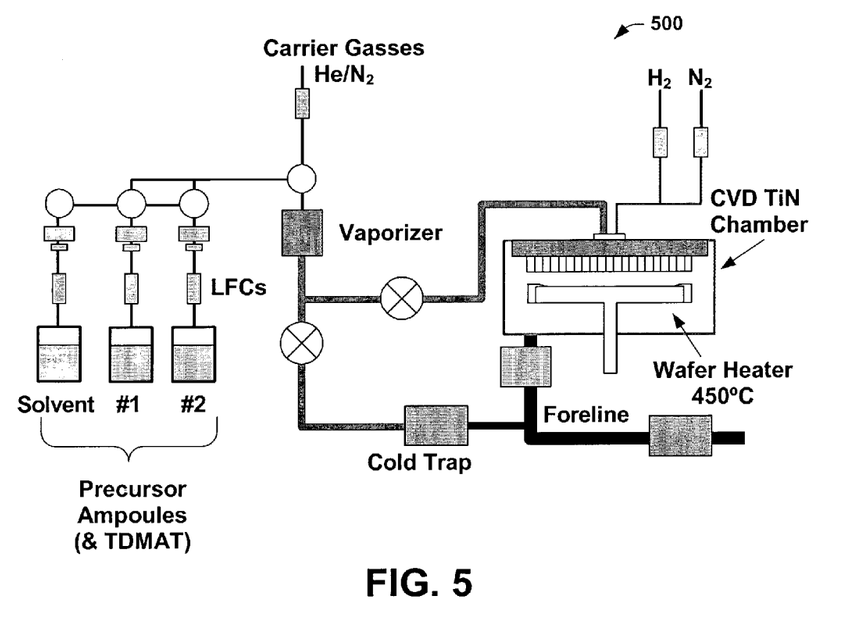
FIG. 5 is a schematic diagram illustrating an apparatus for forming a barrier/liner film in accordance with the CVD TiN process of FIG. 4 of the present invention.

As illustrated in FIG. 5, and in accordance with the present invention, such a TiN film is formed, for example, via a CVD or sputter deposition process using, for example, an AMAT Endura 5500 chamber with a heater temperature of 450 C.

Therefore in accordance with one aspect of the present invention, the top electrode diffusion barrier comprises a bi-layer process. For example, first a PVD Ti film is formed, followed by a CVD TiN film in order to exhibit improved oxidation resistance without the negative use of hydrogen in the plasma treatment of the barrier/liner layer.

A Ti layer as discussed above may be utilized in conjunction with the TiN; and other diffusion barrier layers may be employed, for example, TaSiN, TiSiN, TaAlN, Ti, TiN, Ta, TaN, HfN, ZrN, HfAlN, CrN, TaAlN, CrAlN. The preferred deposition technique for these barrier layers are reactive sputter deposition using Ar+N$_2$ or Ar+NH$_3$. Other deposition techniques that might be used include CVD, ECVD, or plasma enhanced CVD. In any event, it is preferred to use materials that have an equal or slower oxidation rate than TiN.

In addition to the discussion above regarding the diffusion barrier layer, it is desirable to perform a clean operation involving the via within the interlayer dielectric 134 to clean the interface surface. For example, one option is to sputter clean with Ar prior to the deposition of the barrier layer. It is further preferred that this pre-clean occur without a vacuum break prior to the deposition of the barrier.

In addition, the ferroelectric capacitor electrode preferably maintains a relatively low contact resistance. A list of possible materials includes Pt, Pd, PdOx, IrPt alloys, Au, Ru, RuO$_x$, (Ba,Sr,Pb)RuO3, (Sr,Ba,Pb)IrO3, Rh, RhO$_x$, LaSrCoO$_3$, (Ba,Sr)RuO$_3$, LaNiO$_3$.

Figure 6:
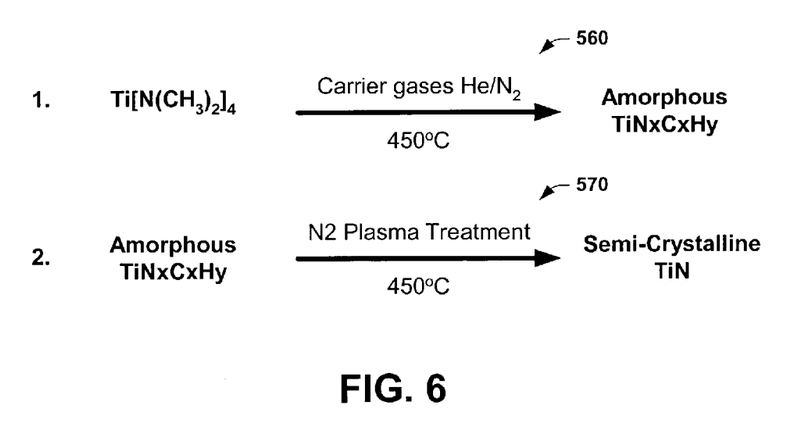
FIG. 6 is a process flow diagram illustrating the deposition conditions for TDMAT in the CVD TiN chamber of FIG. 5 for forming a crystalline TiN film in accordance with an exemplary aspect of the present invention.

FIG. 6 illustrates a process flow diagram for the deposition conditions for TDMAT (a TiN precursor) in the CVD chamber of FIG. 5 for forming a crystalline TiN film in accordance with an exemplary aspect of the present invention. The barrier/liner layer film deposition is performed according to specific parameters, using metalorganic precursors, such as a TDMAT precursor. Use of the pre-mixed precursor "cocktails" provides enhanced repeatability and throughput relative to the use of elemental precursor solutions. The precise composition and molarity of the starting precursor solutions can be varied as needed. Use of pre-mixed "cocktails" permits hardware simplification since only a single vaporizer is needed. Earlier processes employed multiple elemental precursors and required two vaporizers rather than the simplified configuration shown in FIG. 5, however, any apparatus and process for deposition may be employed and is contemplated as falling within the scope of the present invention.

The H$_2$-less CVD TiN process of FIG. 6 comprises two phases. In a first phase 560 of the H$_2$-less CVD TiN process of FIG. 6, amorphous TiNxCxHy is formed from a Ti[N(CH$_3$)$_2$]$_4$ precursor TDMAT. Then, in a second phase 570 of the process of FIG. 6, the amorphous TiNxCxHy is densified and transformed into a semi-crystalline TiN form using a H$_2$-less plasma treatment. In the first phase 560, the Ti[N(CH$_3$)$_2$]$_4$ precursor is conveyed to the wafer in He/N$_2$ carrier gasses providing an atmosphere without the addition of H$_2$, and heated to 450° C. to form the amorphous TiNxCxHy. In the second phase 570, the amorphous TiNxCxHy on the wafer is plasma treated in an atmosphere of N$_2$ at about 500 sccm without the addition of H$_2$, while again being heated to about 450° C. to form the semi-crystalline TiN.

An exemplary CVD chamber operational sequence proceeds as follows. After the wafers are delivered to the CVD chamber, the wafer sits on the lift pins above the wafer heater for about 30 sec (shorter times are also possible, for example, ~5 sec to 30 sec). This allows the wafer to pre-heat, avoiding thermal shock, which in some cases may damage or degrade the wafer. Next, the wafer is lowered onto the wafer heater and the temperature is allowed to stabilize for about 60 sec. During these first two steps, the metalorganic precursors are sent to the vaporizer bypass line, bypassing the process chamber. Barrier/liner layer deposition begins once the precursor flow is diverted into the CVD chamber by opening the chamber valve and closing the bypass valve. For example, typical process parameters provide a deposition rate of approximately 160 Å/min. Deposition ends when the precursors are sent back to the vaporizer bypass line. Following deposition, the wafer remains in the chamber for 5 sec with the throttle valve open to evacuate the chamber before opening the slit valve between chambers for removal.

Figure 7:
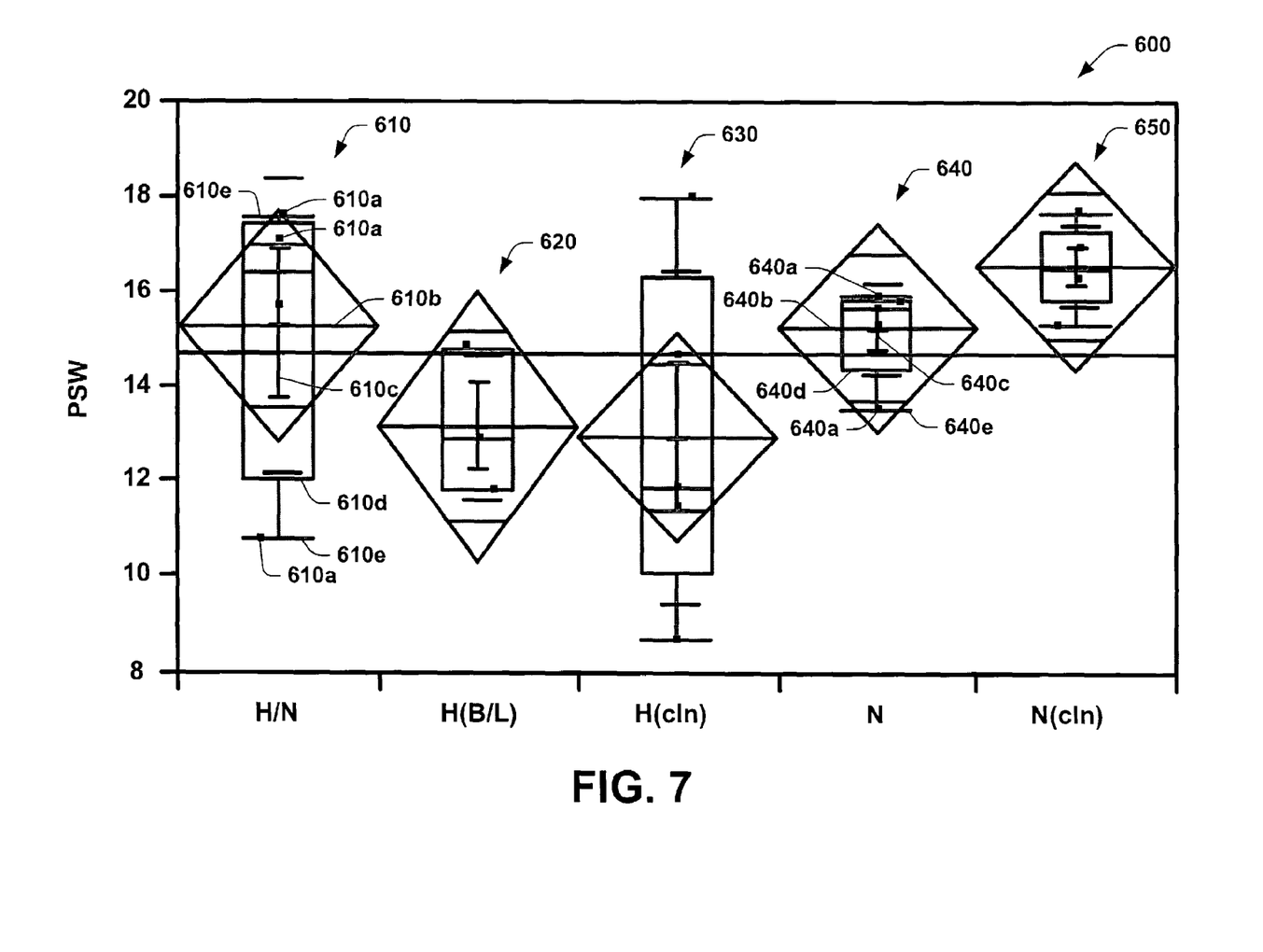
FIG. 7 is a distribution plot illustrating the affect of five TiN formation and plasma treatment methods on the PSW of a PZT ferroelectric film, including two methods accomplished without adding hydrogen in accordance with the present invention.

FIG. 7 illustrates a distribution plot of the results of five variations of the barrier/liner layer formation and plasma treatment process, and their effect on the PSW of a PZT ferroelectric film in a ferroelectric capacitor in accordance with the present invention. FIG. 7 illustrates three prior art processes 610, 620 and 630 utilizing $H_2$ and $N_2$ in the processing atmosphere. FIG. 7 also includes two processes 640 and 650 in accordance with the present invention that utilizes $N_2$, and that do not add $H_2$ to the processing atmosphere. The data represented in the plot is presented as a graphical display associated with the data set referred to as a "box-and-whiskers plot" (boxplot).

For example, process 610 illustrates the results of a prior art process for forming a barrier/liner layer (B/L) in the VIA0 comprising a 240 Å deposition of Ti, followed by a dual deposition and plasma treatment, individually comprising a 75 Å TiN deposition and a plasma treatment (densifying the TiN down to about 40 Å) in an atmosphere utilizing $H_2$ and $N_2$. Process plot 610 illustrates this PSW data as a boxplot comprising a set of individual data points 610a, a median value 610b, a mean distribution range 610c, a box that spans the data $1^{st}$ and $3^{rd}$ quartiles 610d, and a pair of lines at the extents of the boxplot whiskers representing the min/max data 610e.

Process 620 illustrates the results of a prior art process for forming a B/L in the VIA0 comprising a 360 Å deposition of Ti followed by a single deposition of 100 Å TiN and a single plasma treatment in an atmosphere utilizing $H_2$ and $N_2$. The boxplot of process 620 illustrates an adversely lower PSW median value, but also an improved mean distribution range and a tighter grouping of the $1^{st}$ and $3^{rd}$ quartiles.

Process 630 further illustrates the results of a prior art process for forming a B/L in the VIA0 comprising a 75 Å Pre-sputter cleaning using argon, followed by a 240 Å deposition of Ti, then a dual deposition and plasma treatment, individually comprising a TiN deposition and a plasma treatment in an atmosphere utilizing $H_2$ and $N_2$. The boxplot of process 630 also illustrates an adversely lower PSW median value, and a worsened mean distribution range and a dramatically worsened $1^{st}$ and $3^{rd}$ quartiles.

Process 640 illustrates the results of an exemplary process for forming a B/L in the VIA0 in accordance with the present invention. Process 640 comprises a 240 Å deposition of Ti, followed by a dual deposition and plasma treatment (two deposition/plasma treatment iterations), individually comprising a 75 Å TiN deposition and a plasma treatment (densitfying the TiN film down to about 40 Å) in an atmosphere utilizing $N_2$ and excluding $H_2$. The boxplot of process 640 illustrates this PSW data as a set of individual data points 640a, a median value 640b, a mean distribution range 640c, a $1^{st}$ and $3^{rd}$ quartiles 640d, and a min/max data 640e. Analyzing the boxplot of process 640 also illustrates a PSW median value 640b that is comparable to plot of process 610 that utilizes $H_2$, yet process 640 provides a dramatically improved mean distribution range 640c and closely grouped $1^{st}$ and $3^{rd}$ quartiles 640d.

Process 650 illustrates the results of an exemplary process for forming a B/L in the VIA0 in accordance with the present invention. Process 650 comprises a 75 Å Pre-sputter cleaning using argon, followed by a 240 Å deposition of Ti, followed by a dual deposition and plasma treatment, individually comprising a TiN deposition and a plasma treatment in an atmosphere utilizing $N_2$ and excluding $H_2$. Analyzing the boxplot of process 650 illustrates a PSW median value 650b that is significantly improved over the plots of all the other illustrated processes, particularly those that utilize $H_2$. Process 650 further provides a dramatically improved mean distribution range 650c and $1^{st}$ and $3^{rd}$ quartiles 650d, similar to that of the other process 640 of the present invention.

Thus, the contributors to the present invention have discovered that comparable PSW mean values may be obtained without adding $H_2$ and that the PSW may be significantly improved when a pre-sputter argon cleaning operation is utilized. In a set of rather unexpected results, the contributors have further found that the mean distribution range as well as the $1^{st}$ and $3^{rd}$ quartiles are both significantly improved (tighter data grouping) when hydrogen is excluded from the process of the present invention. This feature may be particularly useful in high density FeRAM memory cells to insure a high level of uniformity between memory cells, such as for maintaining better sense margins within the associated read/write circuitry. In another unexpected result, the contributors have discovered that the leakage current within the PZT film of the FeCap is also reduced utilizing the method of the present invention.

Figure 8A:
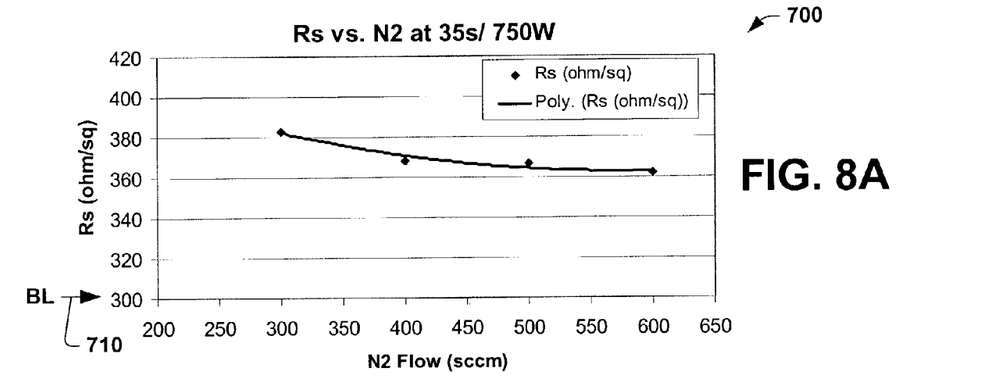
FIGS. 8A–8C are graphs illustrating the result of various process parameter adjustments on controlling the resistivity of a TiN film formed in accordance with the present invention.
Figure 8B:
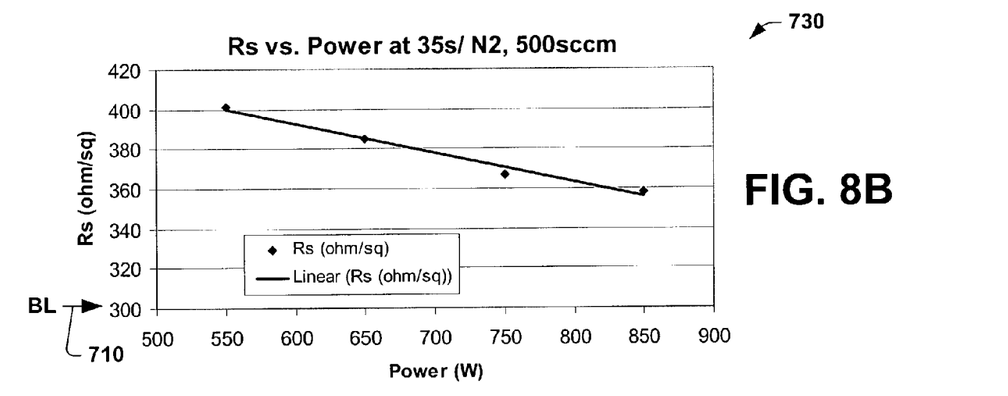
Figure 8C:
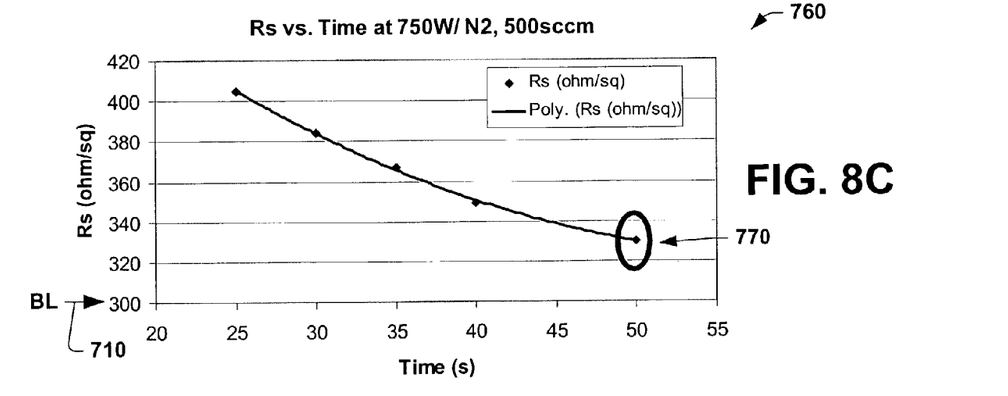

FIGS. 8A–8C illustrate plots of the effects of three process parameter adjustments on the resistivity $R_s$ (ohms/sq) of a TiN film formed and plasma treated in accordance with the present invention. In accordance with one exemplary aspect of the present invention, it is desirable to have a barrier sheet resistance ($R_s$) of about 350 ohms/sq or less. Therefore, it is desirable to tailor the parameters of the process for the TiN VIA0 diffusion barrier film such that the resistivity does not exceed the 350 ohms/sq figure. FIG. 8A, for example, illustrates a plot 700 of the results of four test adjustments of the $N_2$ gas flow rate (sccm) with a 35 second, 750 watt plasma treatment without $H_2$. Plot 700 illustrates $N_2$ gas flow values ranging from 300 sccm to 600 sccm, producing a TiN film with an $R_s$ ranging from about 385 ohms/sq to about 362 ohms/sq respectively. These results, however, indicate only a marginal improvement in $R_s$ from 500 sccm to 600 sccm, and the reason a 500 sccm $N_2$ flow rate was chosen in one preferred aspect of the invention relative to the base line (BL) resistivity 710, which is about 300 ohms/sq.

FIG. 8B illustrates a plot 730 of the $R_s$ results of four test adjustments of the power (watts) with a 35 second, 500 sccm $N_2$ gas flow rate plasma treatment without $H_2$. Plot 730 illustrates power values ranging from 550 watts to 850 watts, producing a TiN film with an $R_s$ ranging from about 402 ohms/sq to about 357 ohms/sq respectively. These results, however, indicate only a modest improvement in $R_s$ from 750 watts to 850 watts, and the reason 750 watts was chosen in one preferred aspect of the invention. However, increasing power in the process does have a somewhat stronger functional correlation to the $R_s$ improvement than increasing the gas flow rate, so increasing the power may provide a useful advantage in some applications.

FIG. 8C illustrates a plot 760 of the $R_s$ results of five test adjustments of the time (seconds) with a 750 watt, 500 sccm $N_2$ gas flow rate plasma treatment without $H_2$. Plot 760 illustrates time values ranging from 25 seconds to 50 seconds, producing a TiN film with an $R_s$ ranging from about 405 ohms/sq to about 330 ohms/sq, respectively. These results indicate a substantial improvement in $R_s$ as the processing time continues close to 50 seconds, then tapers some, thus the reason 50 seconds was chosen in one preferred aspect of the invention. Of the three parameter adjustment tests, the processing time test, demonstrates the largest correlation to $R_s$ improvement gains. Therefore, as with increasing the processing power, further increases of processing time may also provide a useful advantage in some applications utilizing the $H_2$-less CVD TiN process of the present invention.

Further, only the processing time tests utilize the preferred full 50 second plasma processing time and therefore the corresponding significant improvement in $R_s$ indicated. As discussed previously, however, one would not be so motivated previously to increase this testing time with the prior art plasma treatments that added $H_2$, because those $R_s$ results were nearly flat with respect to processing time after about 35 seconds. In addition, one would not be motivated to make the processing parameter adjustments described herein, when the resistivity of the TiN B/L increases as indicated by the baseline resistivity 710. However, the contributors of the present invention have realized that the improvement in the PSW characteristics and data distribution was of greater importance for the applications considered.

In accordance with another exemplary aspect of the present invention, it is desirable to form a dense crystalline TiN barrier film without voids and a low porosity. Accordingly, an increase in film resistivity has been linked to an increase in film porosity. In addition, it is also desirable to tailor the parameters of the process for the TiN VIA0 diffusion barrier film to minimize the content of oxygen and carbon therein which are considered contaminates to the TiN film and further increase the resistivity of the film.

Figure 9:
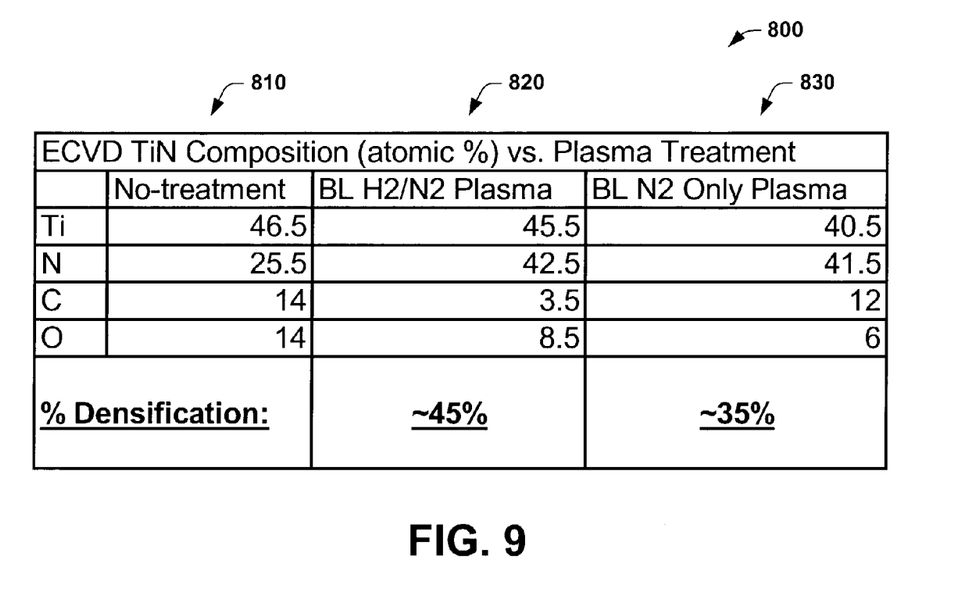
FIG. 9 is a chart illustrating the atomic composition and densification of a TiN film as a result of various plasma treatment conditions, including no treatment, a plasma treatment that includes hydrogen, and a plasma treatment that substantially excludes hydrogen in accordance with the present invention.

FIGS. 9 illustrates a chart 800 of the atomic composition and the percentage densification of a TiN film resulting from several plasma treatment conditions. For example, 810 of FIG. 9, illustrates the composition of the TiN film formed without a plasma treatment to TiN. The result is a composition of about (in atomic %) Ti=46.5%, N=25.5%, C=14%, and O=14%, and has, therefore no film densification improvement. The TiN barrier thus formed, has a high carbon and oxygen content relative to the nitrogen content, and without the plasma treatment has no densification change.

In 820 of FIG. 9, the composition of a TiN film formed with a prior art plasma treatment, wherein $H_2$ and $N_2$ is added to the atmosphere is illustrated. The result is a composition of about Ti=45.5%, N=42.5%, C=3.5%, and O=8.5%, and a film densification of about 45% was obtained. Consequently, the prior art method of forming the TiN barrier utilizing $H_2$ and $N_2$, provides a substantial reduction of the carbon and oxygen content relative to the Ti and N content as well as a good film densification improvement.

In 830 of FIG. 9, the composition of a TiN film formed using a plasma treatment in accordance with the present invention, wherein $N_2$ without $H_2$ is added to the atmosphere. The result is a composition of about Ti=40.5%, N=41.5%, C=12%, and O=6%, and a film densification of about 35% was obtained. Consequently, the method of forming the TiN barrier of the present invention provides a comparable Ti and N composition with an acceptable densification improvement. For this and other reasons discussed earlier, one would typically not be motivated to make these process parameter changes (removing $H_2$) that slightly increase the content of C and O, and decrease the densification. However, the contributors of the present invention have realized that for the applications considered, these process parameter adjustments provide a substantial reduction in hydrogen diffusion into the PZT dielectric of an FeCap. The contributors also discovered that these parameter adjustments made possible an improvement in the PSW characteristics and PSW data distribution with a comparable barrier/liner layer sheet resistance, a comparable Ti and N content, and an acceptable densification.

Figure 4:
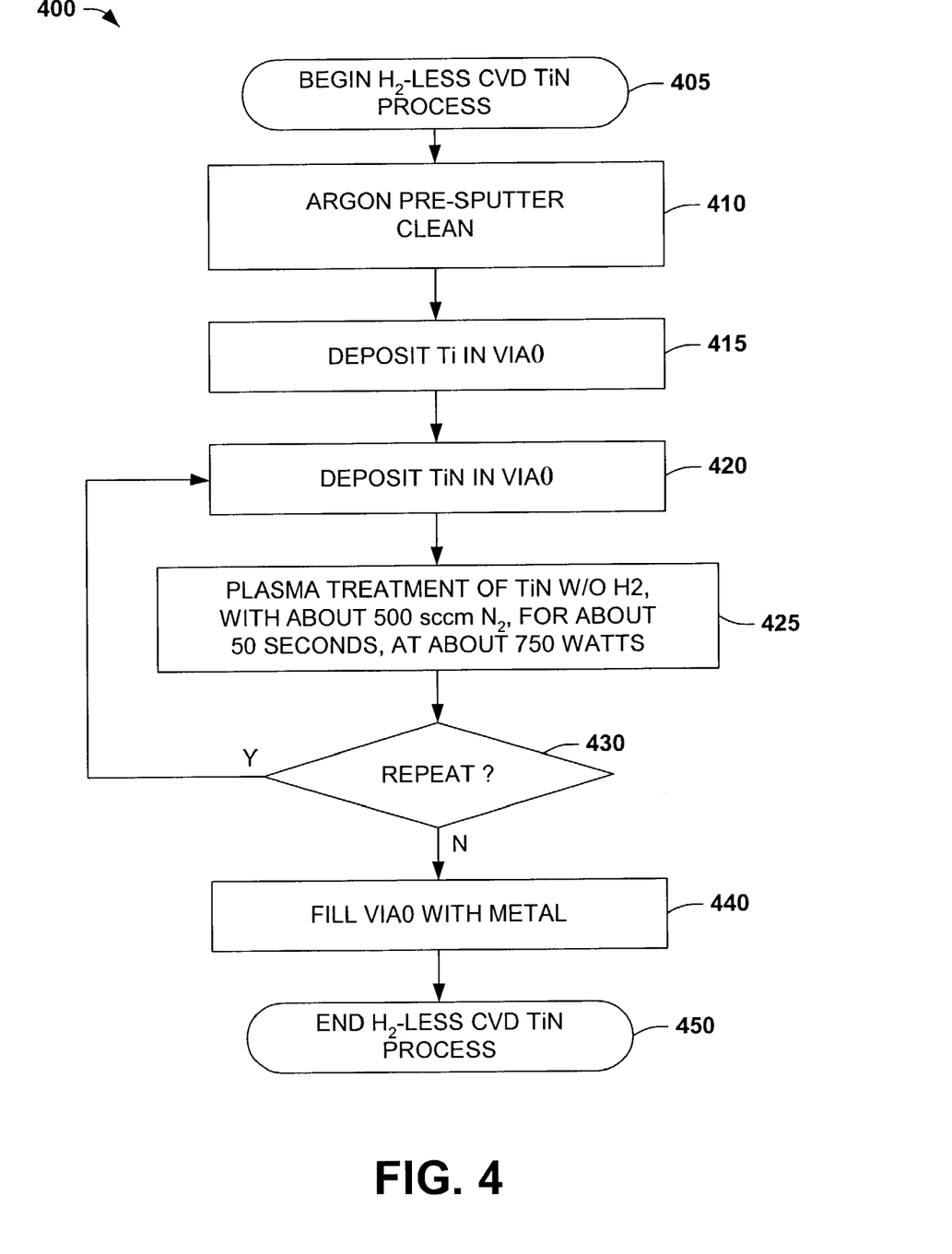
FIG. 4 is a flow chart diagram illustrating a method of forming a TiN barrier layer in a via of a ferroelectric capacitor using a CVD TiN process substantially excluding hydrogen in accordance with another exemplary aspect of the present invention.
Figure 10:
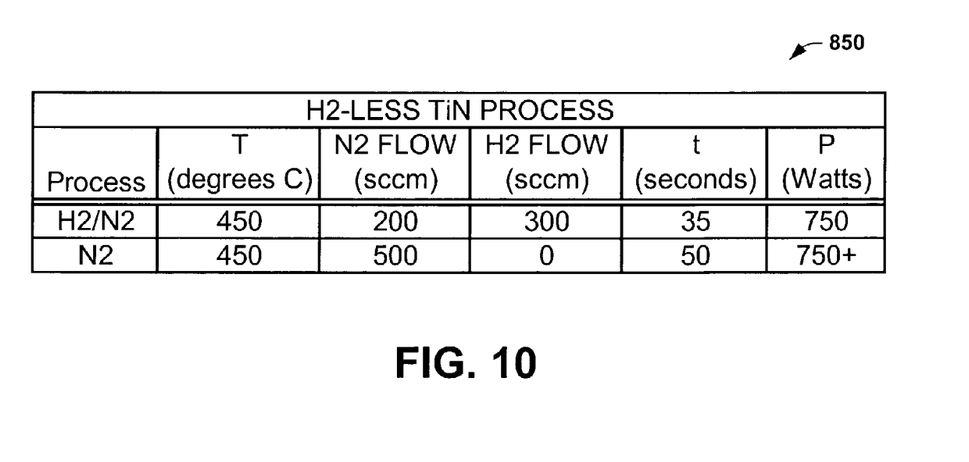
FIG. 10 is a chart illustrating two exemplary sets of process conditions for plasma treating a TiN film, including a plasma treatment that includes hydrogen, and plasma treatment that substantially excludes hydrogen in accordance with one aspect of the present invention.

FIG. 10 illustrates a chart 850 comparing an exemplary set of the process parameters for plasma treating a TiN film according to the prior art $H_2/N_2$ usage, and according to the $N_2$ usage of the present invention and as described in association with the method of FIGS. 4–6. Comparing the two exemplary processes, the processing temperatures (450° C.) and power levels (750 watts) are similar as these parameters may result in less improvement to the PSW characteristics, while a power increase does still hold some improvement potential. The total of the $N_2$ (200 sccm) and $H_2$ (300 sccm) gas flows of the prior art shown, was used as a general guide to the $N_2$ gas flow rate (500 sccm) of the present invention, to keep the total flow rate (500 sccm) in the chamber similar. Increasing the processing time t from 35 seconds to 50 seconds proved to be one of the most significant adjustments to the process parameters of the present invention for a plasma treatment that substantially excludes hydrogen, and avoids the negative effects of hydrogen diffusion into the PZT dielectric of an FeCap which may degrade substantially the FeRAM performance.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming a chemical vapor deposited titanium nitride layer for an FeRAM capacitor, comprising:
   depositing the chemical vapor deposited titanium nitride layer over a substrate; and
   treating the chemical vapor deposited titanium nitride layer using a plasma treatment substantially excluding hydrogen, wherein the plasma treatment substantially excluding hydrogen comprises:
      providing a nitrogen containing plasma in an atmosphere substantially free of hydrogen; and
      heating the chemical vapor deposited titanium nitride layer to about 450° C. for about 50 seconds at a power level of about 750 watts while exposing the chemical vapor deposited titanium nitride layer to the nitrogen containing plasma.

2. The method of claim 1, wherein the chemical vapor deposited titanium nitride layer is formed over a ferroelectric capacitor stack that overlies the substrate.

3. The method of claim 1, further comprising:
forming a via in a dielectric layer overlying the substrate, the via having a bottom surface;
cleaning the bottom surface of the via using an argon pre-sputter process; and
depositing a titanium layer in the via prior to depositing the chemical vapor deposited titanium nitride layer, wherein the chemical vapor deposited titanium nitride layer overlies the titanium layer in the via.

4. The method of claim 1, further comprising depositing a titanium layer over the substrate prior to depositing the chemical vapor deposited titanium nitride layer.

5. The method of claim 4, further comprising filling the via with metal after depositing the titanium layer and the chemical vapor deposited titanium nitride layer in the via.

6. The method of claim 1, wherein the atmosphere in the plasma treatment includes a nitrogen flow of about 500 sccm.

7. A method of forming a ferroelectric memory device, comprising:
forming a bottom electrode layer, a ferroelectric dielectric layer, a top electrode layer, and a hard mask layer over a substrate;
patterning the hard mask layer;
patterning the bottom electrode layer, the ferroelectric dielectric layer, and the top electrode layer using the hard mask to define a ferroelectric capacitor stack;
forming an interlayer dielectric layer over the ferroelectric capacitor stack;
forming a via in the dielectric layer down to the hard mask;
forming a barrier layer in the via;
wherein at least one of the hard mask layer and the barrier layer comprises a chemical vapor deposited titanium nitride film, and
wherein the forming of the chemical vapor deposited titanium nitride film comprises:
depositing a chemical vapor deposited titanium nitride layer; and
treating the chemical vapor deposited titanium nitride layer using a plasma treatment substantially excluding hydrogen,
wherein the barrier layer comprises the chemical vapor deposited titanium nitride film, and wherein the plasma treatment substantially excluding hydrogen for the chemical vapor deposited titanium nitride barrier layer, comprises:
providing a chemical vapor deposition of titanium nitride in an atmosphere substantially free of hydrogen; and
heating the chemical vapor deposited titanium nitride layer to about 450° C. for about 50 seconds at a power level of about 750 watts while exposing the chemical vapor deposited titanium nitride layer to a nitrogen containing plasma.

8. The method of claim 7, wherein the via is formed over the ferroelectric capacitor stack.

9. The method of claim 7, further comprising:
cleaning a bottom surface of the via using an argon pre-sputter process; and
depositing a titanium layer in the via using an ion metalized plasma of titanium.

10. The method of claim 7, further comprising filling the via after forming the barrier layer therein with metal.

11. The method of claim 7, wherein the atmosphere in the plasma treatment includes a nitrogen flow of about 500 sccm.

* * * * *